US011131929B2

(12) United States Patent
Dunphy et al.

(10) Patent No.: US 11,131,929 B2
(45) Date of Patent: Sep. 28, 2021

(54) SYSTEMS AND METHODS THAT UTILIZE ANGLED PHOTOLITHOGRAPHY FOR MANUFACTURING LIGHT GUIDE ELEMENTS

(71) Applicant: Waymo LLC, Mountain View, CA (US)

(72) Inventors: James Dunphy, San Jose, CA (US); David Hutchison, Santa Clara, CA (US)

(73) Assignee: Waymo LLC, Mountain View, CA (US)

( * ) Notice: Subject to any disclaimer, the term of this patent is extended or adjusted under 35 U.S.C. 154(b) by 108 days.

(21) Appl. No.: 16/183,728

(22) Filed: Nov. 7, 2018

(65) Prior Publication Data

US 2020/0142312 A1 May 7, 2020

(51) Int. Cl.
*G03F 7/20* (2006.01)
*G03F 7/26* (2006.01)
(Continued)

(52) U.S. Cl.
CPC ............ *G03F 7/201* (2013.01); *G03F 7/0005* (2013.01); *G03F 7/2008* (2013.01);
(Continued)

(58) Field of Classification Search
CPC .......... G03F 7/2008; G03F 7/26; G03F 7/201; G03F 7/7015; G03F 7/005; G03F 7/2014;
(Continued)

(56) References Cited

U.S. PATENT DOCUMENTS 4,560,249 A * 12/1985 Nishiwaki ................ G02B 5/32
359/3
4,842,405 A * 6/1989 El-Sherif ........... G02B 6/02066
359/566

(Continued)

FOREIGN PATENT DOCUMENTS

JP 56-150703 * 11/1981
JP 60-007405 * 1/1985

(Continued)

OTHER PUBLICATIONS

Bagal et al., "Fabrication of a subwavelength periodic nanostructures using liquid immersion llyoyd's mirror interference lithography" Opt. Lett., vol. 38(14) pp. 2531-2534 (Jul. 2013).*

(Continued)

*Primary Examiner* — Martin J Angerbranndt
(74) *Attorney, Agent, or Firm* — McDonnell Boehnen Hulbert & Berghoff LLP

(57) ABSTRACT

Systems and methods described herein relate to the manufacture of optical elements and optical systems. An example system may include an optical component configured to direct light from a light source to illuminate a photoresist material at a desired angle and to expose at least a portion of an angled structure in the photoresist material, where the photoresist material overlays at least a portion of a top surface of a substrate. The optical component includes a container containing an light-coupling material that is selected based in part on the desired angle. The optical component also includes a mirror arranged to reflect at least a portion of the light to illuminate the photoresist material at the desired angle.

17 Claims, 15 Drawing Sheets

(51) Int. Cl.
*G03F 7/00* (2006.01)
*G02B 5/08* (2006.01)

(52) U.S. Cl.
CPC .............. *G03F 7/2014* (2013.01); *G03F 7/26* (2013.01); *G03F 7/7015* (2013.01); *G02B 5/0891* (2013.01)

(58) Field of Classification Search
CPC .... G02B 2006/12176; G02B 6/421401; G02B 5/0891
See application file for complete search history.

(56) References Cited

U.S. PATENT DOCUMENTS

| | | | |
|---|---|---|---|
| 5,263,111 A | | 11/1993 | Nurse et al. |
| 5,363,220 A | * | 11/1994 | Kuwayama .......... G02B 5/1857 359/13 |
| 5,879,866 A | * | 3/1999 | Starikov .............. G03F 7/0035 216/38 |
| 6,510,263 B1 | | 1/2003 | Maisenholder et al. |
| 6,608,722 B2 | | 8/2003 | Cowan et al. |
| 6,727,046 B1 | | 4/2004 | Bryan-Brown et al. |
| 6,743,554 B2 | | 6/2004 | Nakao |
| 6,882,477 B1 | * | 4/2005 | Schattenburg ...... G03F 7/70383 359/35 |
| 6,917,456 B2 | | 7/2005 | Reboa et al. |
| 7,253,425 B2 | | 8/2007 | Livesay et al. |
| 7,932,020 B2 | | 4/2011 | Pierrat et al. |
| 8,546,048 B2 | | 10/2013 | Riege |
| 9,329,326 B2 | | 5/2016 | Marttila et al. |
| 9,360,615 B1 | | 6/2016 | Jalava |
| 2004/0234224 A1 | * | 11/2004 | Ishizaki ............... G02B 6/1221 385/129 |
| 2005/0036121 A1 | | 2/2005 | Hoogendam et al. |
| 2008/0117396 A1 | * | 5/2008 | Hori ....................... G03B 27/42 355/53 |
| 2010/0195082 A1 | | 8/2010 | Yoon et al. |
| 2013/0003035 A1 | | 1/2013 | Chang et al. |
| 2014/0055861 A1 | | 2/2014 | Li et al. |
| 2015/0049314 A1 | | 2/2015 | Fukazawa |
| 2015/0338718 A1 | | 11/2015 | Zhang et al. |
| 2018/0261972 A1 | | 9/2018 | Filgas et al. |

FOREIGN PATENT DOCUMENTS

| | | | |
|---|---|---|---|
| JP | 63-250602 | * | 10/1988 |
| JP | 02-067559 | * | 3/1990 |
| JP | 04-100082 | * | 4/1992 |
| JP | 04-133383 | * | 4/1992 |
| JP | 06-067607 | * | 3/1994 |
| JP | 2001-006175 | * | 1/2001 |
| JP | 2004-133300 | * | 4/2004 |
| JP | 2005-129894 | * | 5/2005 |
| JP | 2005250021 | | 9/2005 |
| JP | 2006056145 | | 3/2006 |
| JP | 2010-0148811 | * | 1/2010 |
| JP | 2011-253151 | * | 11/2011 |
| JP | 2012-068297 | * | 4/2012 |
| JP | 2012-220919 | * | 11/2012 |

OTHER PUBLICATIONS

Tsang, "Theoretical modeling of the simultaneous exposure and development of (SED) process of a positive resist", Appl. Opt., vol. 16(7) pp. 1918-1930 (Jul. 1977).*
Machine translation of JP 2011-253151 (2011).*
Machine translation of 06-067607 (Mar. 1994).*
Machine translation of 2005-129894 (May 2005).*
Machine translation of 04-100082 (Apr. 1992).*
Machine translation of 63-250602 (Oct. 1988).*
Machine translation of JP 2010-014811 (Jan. 2010).*
International Searching Authority, International Search Report and Written Opinion dated Feb. 7, 2020, issued in connection with International Patent Application No. PCT/US2019/057858, filed Oct. 24, 2019, 14 pages.

* cited by examiner

Top View

Bottom View

Oblique View

Top View

Side View

SYSTEMS AND METHODS THAT UTILIZE ANGLED PHOTOLITHOGRAPHY FOR MANUFACTURING LIGHT GUIDE ELEMENTS

BACKGROUND

Unless otherwise indicated herein, the materials described in this section are not prior art to the claims in this application and are not admitted to be prior art by inclusion in this section.

Light guiding devices may include optical fibers, waveguides, and other optical elements (e.g., lenses, mirrors, prisms, etc.). Such light guiding devices may transmit light from an input facet to an output facet via total or partial internal reflection. Furthermore, light guiding devices may include active and passive optical components, such as optical switches, combiners, and splitters.

Optical systems may utilize light guiding devices for a variety of purposes. For example, optical fibers may be implemented to transmit optical signals from a light source to a desired location. In the case of light detection and ranging (LIDAR) devices, a plurality of light sources may emit light, which may be optically coupled to the light guiding devices so as to be directed into a given environment. The light emitted into the environment may be detected by a receiver of the LIDAR devices so as to provide estimated distances to objects in the environment.

SUMMARY

Systems and methods described herein are applicable to the manufacture of optical systems. For example, the present disclosure describes certain optical elements (e.g., light guide devices) and methods for their manufacture. The optical elements may include one or more structures such as vertical and/or angled structures.

In a first aspect, a system is provided. The system may include an optical component configured to direct light emitted by a light source to illuminate a photoresist material at a desired angle and to expose at least a portion of an angled structure in the photoresist material, where the photoresist material overlays at least a portion of a top surface of a substrate. The optical component includes a container containing a light-coupling material that is selected based in part on the desired angle. The optical component also includes a mirror arranged to reflect at least a portion of the light to illuminate the photoresist material at the desired angle.

In a second aspect, a method is provided. The method includes placing a substrate near one end of an optical component, where photoresist material overlays at least a portion of a top surface of the substrate, and where the optical component comprises: (i) a container containing a light-coupling material, and (ii) a mirror. The method also includes causing a light source to emit light into the optical component, where the mirror reflects at least a portion of the light to illuminate the photoresist material at a desired angle, thereby exposing at least a portion of an angled structure in the photoresist material.

In a third aspect, a method of fabricating an optical element is provided, the method comprising the steps of: placing a substrate near one end of an optical component, where photoresist material overlays at least a portion of a top surface of the substrate, and wherein the optical component comprises: (i) a container containing an light-coupling material, and (ii) a mirror; and causing a light source to emit light into the optical component, wherein the mirror reflects at least a portion of the emitted light to illuminate the photoresist material at a desired angle, thereby exposing at least a portion of an angled structure in the photoresist material.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Other aspects, embodiments, and implementations will become apparent to those of ordinary skill in the art by reading the following detailed description, with reference where appropriate to the accompanying drawings.

DETAILED DESCRIPTION

Figure 1A:
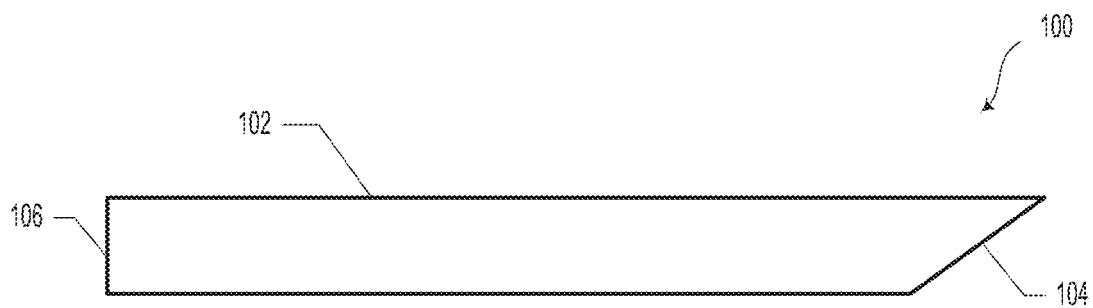
FIG. 1A illustrates an optical element, according to an example embodiment.
Figure 1A:
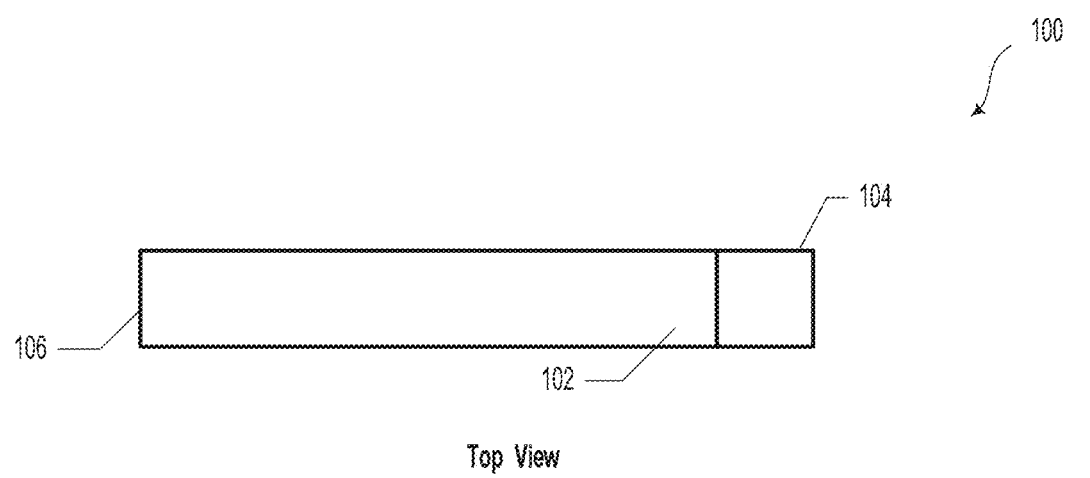
Figure 1A:
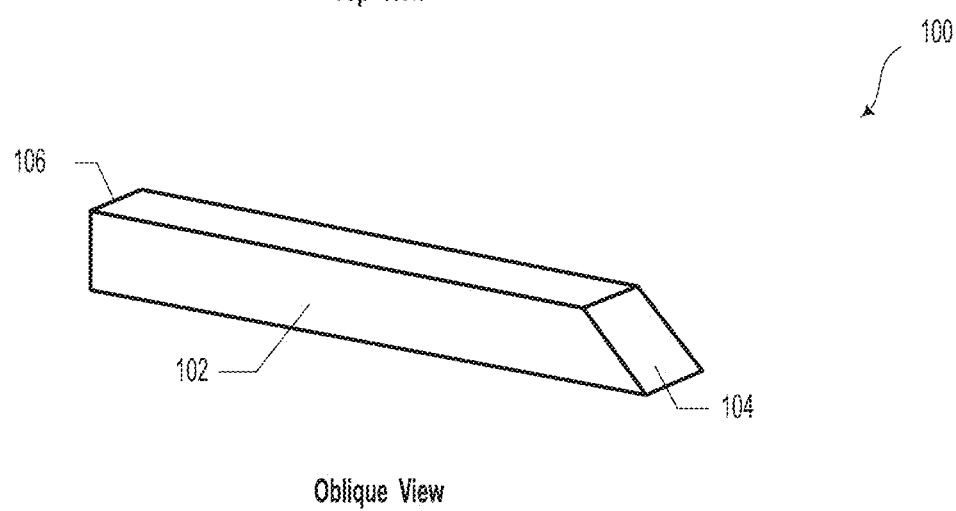

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. OVERVIEW

Light guides may include optical elements that may be configured to guide light within the light guides. These optical elements may include structures that may reflect light (totally or partially) in order to transmit light from an input facet to an output facet of the light guide. For example, the optical elements may be vertical and/or angled structures that may guide light. More specifically, a vertical structure may guide light along a length of the structure. An angled structure may be coated with a metal that is optically reflective, thereby effectively functioning as a mirror that may reflect incident light in a particular direction.

In an example embodiment, light guides may be formed from a photoresist material and may be configured to guide infrared light.

In practice, light guides may be fabricated using photolithography, which uses a light source to expose structures of the optical elements in a photoresist material that overlays a substrate. The desired structures may be exposed by exposure light that illuminates the photoresist with a particular pattern. In particular, vertical structures are exposed by exposure light that is normally incident on the photoresist material so as to expose the photoresist at a normal angle.

On the other hand, angled structures are exposed by exposure light that is incident on the photoresist material at a non-normal angle. For example, to expose an angled structure, a refractive angle of the light in the photoresist material must be at a desired angle of the angled structure. However, achieving some refractive angles in the photoresist material can be challenging. For instance, when a medium between the light source and the photoresist material is air, the refractive angle in the photoresist material needed to expose some angled structures may not be achievable according to Snell's law.

One current solution is to use immersion photolithography to achieve the desired refractive angles in the photoresist material. In this solution, the substrate may be immersed in a medium that has a moderate refractive index. The material is chosen to have an index high enough to transmit light that refracts to the designed angles in the photoresist material according to Snell's law. To expose angled structures in the immersed photoresist material, a robotic device moves a light source at specific angles with respect to the photoresist material to expose the photoresist material at the desired angles. Although this solution may be used to fabricate angled structures, it is inefficient and time-consuming. In practice, fabricating optical elements using such a technique may take several hours.

Disclosed herein are methods and systems for efficiently fabricating optical elements. The methods and systems disclosed herein may provide improvements over the current fabrication methods and systems. For example, the methods and systems disclosed herein may fabricate the optical elements more rapidly and efficiently than the systems described above.

In an embodiment, a fabrication system may include a light source and an optical component located in proximity of the light source. The fabrication system may be configured to expose a substrate that is provided in proximity of the optical component. To do so, the fabrication system may cause the light source to emit light towards the optical component. The optical component may manipulate the emitted light in order to expose the photoresist material with exposure light that has a particular pattern and/or angles. For instance, the exposure light may have a particular pattern and/or may be incident at angles that may expose vertical and/or angled structures in the photoresist material.

In an embodiment, the optical component may include a container that contains a light-coupling material through which emitted light may travel to expose the photoresist material. The light-coupling material may be selected to have a refractive index that makes it feasible for the exposure light to be refracted in the photoresist material at desired refraction angles.

The optical system may also include one or more mirrors that may be arranged to reflect light toward the photoresist material at desired angles. Because the reflected light is traveling through the light-coupling material, the incident light on the photoresist material may be refracted in the photoresist material at an angle, thereby exposing an angled structure in the photoresist material. Accordingly, light reflected off of the one or more mirrors in the optical component may expose angled structures in the photoresist material.

In an embodiment, the fabrication system may use an aperture mask with one or more openings in order to select a portion of the emitted light to enter the optical component. In particular, the aperture mask may direct a portion of the emitted light toward the one or more mirrors, which may reflect the portion of the emitted light to illuminate the photoresist with angled exposure light. Additionally, the aperture mask may select a portion of the emitted light such that the portion of light travels at a normal angle through the light-coupling material. This portion of light may be incident on the photoresist material at a normal angle, thereby exposing a vertical structure in the photoresist material.

II. EXAMPLE OPTICAL ELEMENTS AND OPTICAL SYSTEMS

FIG. 1A illustrates an optical element 100, according to an example embodiment. The optical systems and methods of manufacture described herein may include optical element 100. In some cases, the optical element 100 may be formed from a polymeric material, such as photoresist. For example, the polymeric material may include SU-8 polymer, Kloe K-CL negative photoresist, Dow PHOTOPOSIT negative photoresist, or JSR negative tone THB photoresist. It will be understood that the optical element 100 may be formed from other polymeric photo-patternable materials.

In some embodiments, the optical element 100 may include an elongate structure 102. Additionally, the optical element 100 may include an angled portion 104. The angled portion 104 may be a first end facet of the optical element 100. The optical element 100 may also include a second end facet 106. While FIG. 1A illustrates the optical element 100 as having a certain shape, other shapes are possible and contemplated herein.

In example embodiments, the optical element 100 may be configured to guide light. For example, the optical element 100 may be configured to couple light from a light source via the second end facet 106. Such light may be guided within at least a portion of the optical element 100 via total internal reflection. In some embodiments, at least a portion of the light may be coupled out of the optical element via the angled portion 104.

In some embodiments, the angled portion 104 of the optical element 100 may include a reflective material, such as a metallic coating. In some embodiments, the metallic coating may include one or more metals such as titanium, platinum, gold, silver, aluminum, and/or another type of metal. In other embodiments, the angled portion 104 may include a dielectric coating and/or a dielectric stack.

Figure 1B:
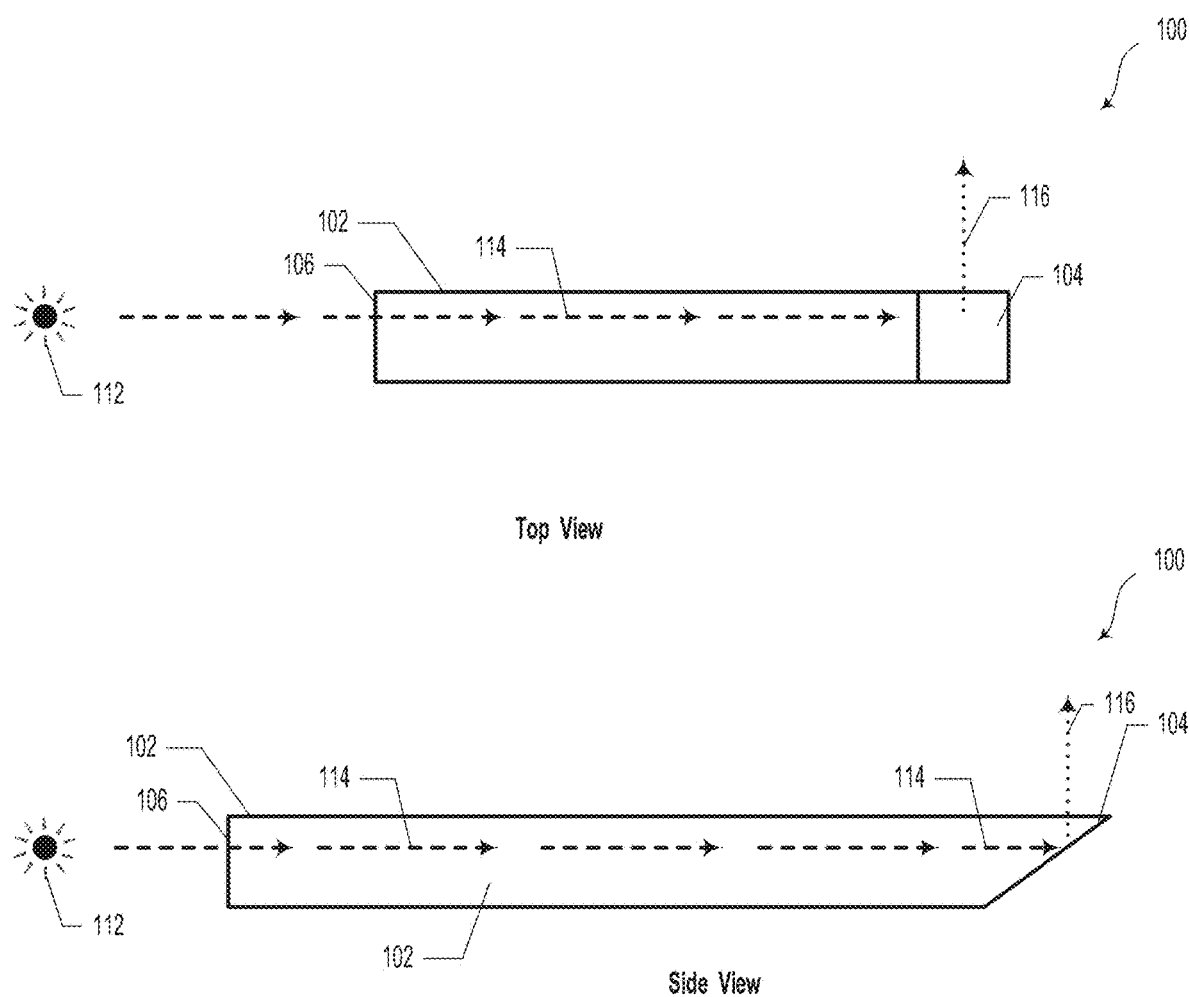
FIG. 1B illustrates the optical elements of FIG. 1A reflecting light, according to example embodiments.

FIG. 1B illustrates the optical element 100 reflecting light, according to an example embodiment. In an example embodiment, a light source 112 may emit light that may be coupled via the second end facet 106 into a light guide portion 102 as coupled emission light 114. The coupled emission light 114 may be outcoupled to an environment via the first end facet 104. The outcoupled light may include transmitted light 116, which may interact with objects in the environment (e.g., via reflection, absorption, and/or refraction).

Figure 1C:
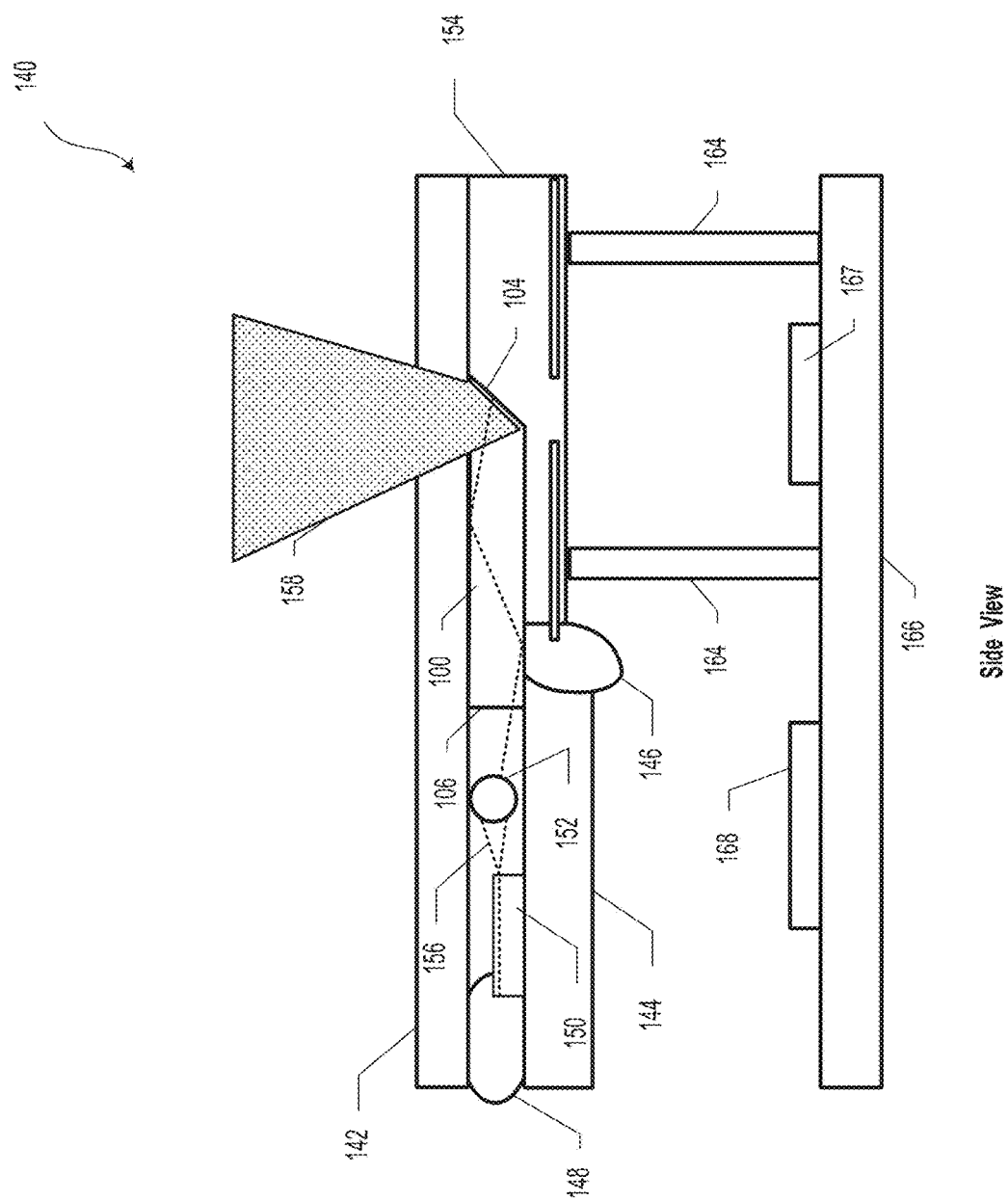
FIG. 1C illustrates an optical system, according to an example embodiment.

FIG. 1C illustrates an optical system 140, which may describe a compact LIDAR system that incorporates optical light guide elements. Such a LIDAR system may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

The optical system 140 is one of a variety of different optical systems that may include light guides such as optical element 100, as illustrated and described in reference to FIG. 1A. In an example embodiment, optical element 100 may be coupled to a transparent substrate 142. The optical element 100 may be coupled to a further transparent substrate 144 via an optical adhesive 146. Additionally, the transparent substrate 144 may be coupled to the transparent substrate 142 via an epoxy material 148.

The optical system 140 may include a laser assembly that includes the transparent substrate 144 and one or more laser bars 150, each of which is coupled to a respective elongate structure. Other ways to fix the one or more laser bars 150 to the transparent substrate 144 are possible and contemplated herein, such as using the epoxy material 148.

The one or more laser bars 150 may be configured to emit light towards a cylindrical lens 152, which may help focus, defocus, direct, and/or otherwise couple the emitted light into the optical element 100. As shown in FIG. 1C, the laser bar 150 may emit light 156, which may be coupled into the optical element 100 via the second end facet 106. The coupled emission light 156 may be outcoupled to an environment via the angled portion 104. The outcoupled light may include transmitted light 158, which may interact with objects in the environment (e.g., via reflection, absorption, and/or refraction).

The optical system 140 may additionally or alternatively include a further substrate 166. In some embodiments, a controller 168 and at least one photodetector 167 may be coupled to the further substrate 166. Furthermore, the further substrate 166 can be coupled to a substrate 154 via one or more light shields 164. In an example embodiment, the light shields 164 could be "honeycomb" type optical baffles or another type of opaque material. In some embodiments, the at least one photodetector 167 may include silicon photomultipliers (SiPMs), avalanche photodiodes (APD), or another type of photosensor, which may be arranged in a linear or areal array.

Furthermore, while FIG. 1C illustrates a single laser bar 150, a single optical element 100 and a single photodetector 167, it is understood that a plurality of such elements is possible and contemplated herein. For example, some embodiments may include 256 laser bars, 256 optical elements, and a corresponding number of photodetectors.

In some embodiments, the photodetector 167 could include a complementary metal-oxide semiconductor (CMOS) image sensor. Additionally or alternatively, the photodetector 167 may include at least one of a silicon photomultiplier (SiPM), a linear mode avalanche photodiode (LMAPD), a PIN diode, a bolometer, and/or a photoconductor. It will be understood that other types of photodetectors (and arrangements thereof) are possible and contemplated herein.

The controller 168 of optical system 140 includes a memory and at least one processor. The at least one processor may include, for instance, an application-specific integrated circuit (ASIC) or a field-programmable gate array (FPGA). Other types of processors, computers, or devices configured to carry out software instructions are contemplated herein. The memory may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

In some embodiments, the optical system 140 may be a LIDAR system configured to provide information indicative of objects within an environment of the optical system. As such, in some cases, the optical system 140 may be disposed on a vehicle, such as a self-driving car, a self-driving truck, a drone aircraft, and/or a drone boat. Other types of vehicles are possible and contemplated herein.

III. EXAMPLE SYSTEMS AND METHODS FOR FABRICATING OPTICAL ELEMENTS a. Example System For Fabricating Optical Elements

In line with the discussion above, some desired structures can be challenging to fabricate using current photolithography systems. For instance, fabricating some angled structures may not be feasible when the medium between the light source and the photoresist material is air. Specifically, according to Snell's law, the angles of refraction in the photoresist material required to expose the angled structures may not be achievable when the medium between the light source and the photoresist material is air.

Disclosed herein are methods and systems for fabricating optical elements, such as optical element 100, as illustrated and described in reference to FIG. 1A. In particular, the methods and systems may be used to fabricate optical elements that include desired structures (e.g., desired angled and/or vertical structures). Further, the methods and systems disclosed herein may fabricate optical elements more rapidly and efficiently than fabrication systems currently used in practice.

Figure 2A:
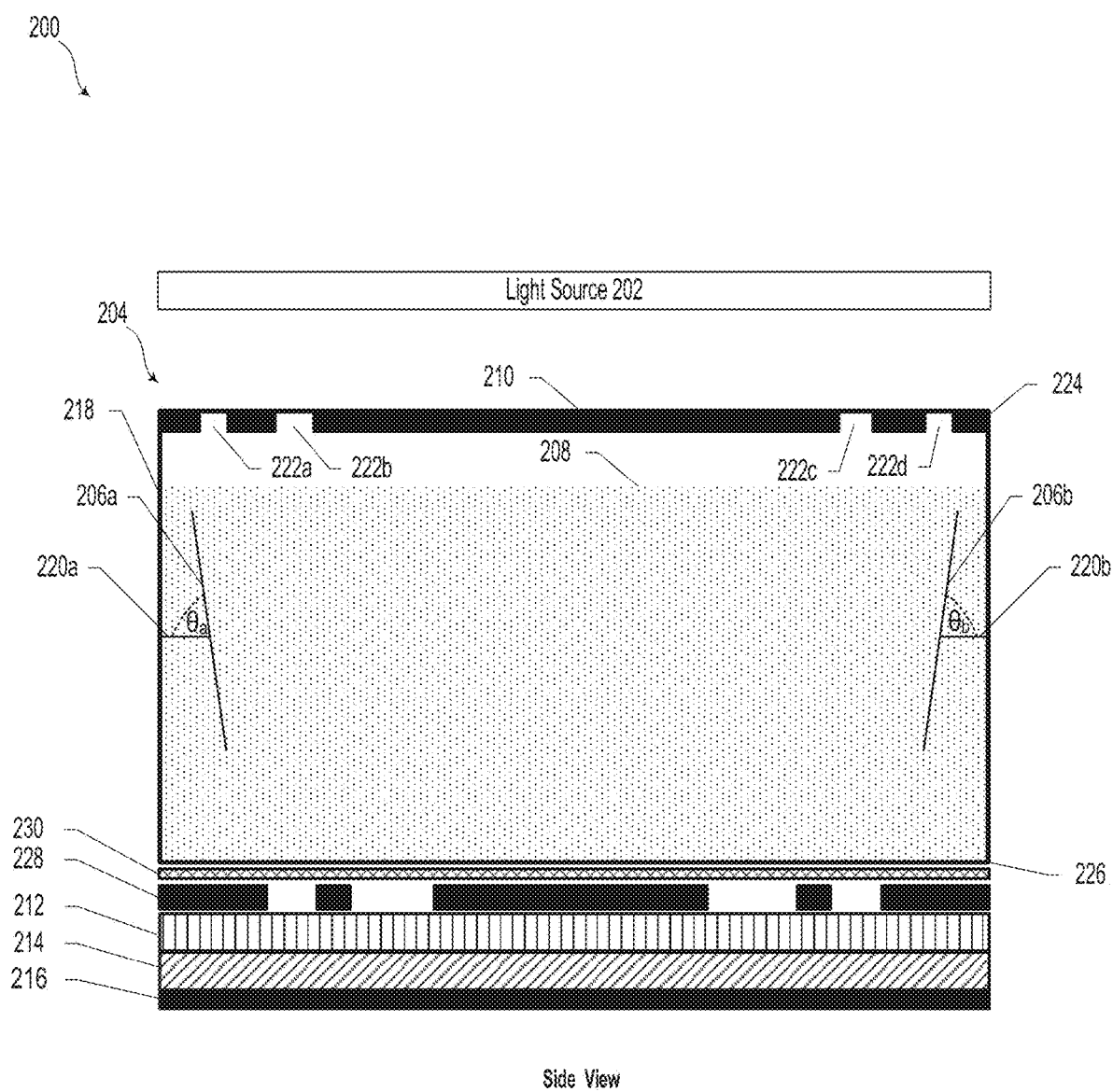
FIG. 2A illustrates a side view of an optical component, according to an example embodiment.

FIG. 2A illustrates a side view of a fabrication system 200 for fabricating optical elements, according to an example embodiment. As shown in FIG. 2A, the fabrication system 200 may include a light source 202 and an optical component 204. Here, the fabrication system 200 may be a photolithography system that may be configured to fabricate optical elements by exposing desired structures in a photo-patternable material. As explained herein, the optical component 204 may be configured to manipulate light emitted by the light source 202 in order to expose the desired structures in the photo-patternable material that overlays a substrate that is optically coupled to the optical component 204.

By way of example, a substrate 214 may be optically coupled to the optical component 204. The substrate 214 may be a transparent substrate that may include glass and/or another transparent material. Further, the substrate 214 may be coupled to an opaque material 216, which may include an optical absorber material. As shown in FIG. 2A, a photo-patternable material 212 overlays the substrate 214. The photo-patternable material 212 may include a photoresist or any other photo-patternable material described herein (e.g., SU-8 polymer, Kloe K-CL negative photoresist, Dow PHOTOPOSIT negative photoresist, or JSR negative tone THB photoresist). In such scenarios, the photo-patternable material 212 may be prepared by depositing a photoresist onto the substrate 214 followed by baking the photoresist.

In an embodiment, the light source 202 may be configured to emit light that is used to expose of the photo-patternable material 212. The light source 202 may be configured to emit one or more wavelengths of light. For instance, the light source 202 may be configured to emit visible light and/or ultraviolet (UV) light. Furthermore, the light source 202 may include one or more components (e.g., a collimator) that enable the light source 202 to emit collimated or substantially collimated light. For instance, the light may be collimated using anisotropic collimation.

In some embodiments, the light source 202 may emit p-polarized light in order to reduce reflections from the substrate-resist interface and from a back-side of the substrate 214. Accordingly, the light source 202 may include a polarizer (e.g., a polarization filter) that enables the light source 202 to emit p-polarized light. Additionally and/or alternatively, the light source 202 may include an integrated timer, which may allow the fabrication system 200 to control an exposure time. In an example implementation, the light source 202 may be a 500 W UV lamp source. In another example implementation, the light source 202 may be a 500 W collimated UV lamp source.

In an embodiment, the optical component 204 may be configured to manipulate the emitted light in order to expose the photo-patternable material 212. To manipulate the emitted light, the optical component 204 may be located in proximity of and optically coupled to the light source 202. In an implementation, the optical component 204 may be located beneath the light source 202.

As shown in FIG. 2A, the optical component 204 may include a container 218. The container 218 may be made from one or more materials, such as aluminum and/or other types of metal. A portion of one surface of the container 218 may be transparent so that the emitted light may enter the container 218. A portion of another surface of the container may also be transparent in order for light to exit the container 218 to expose the photo-patternable material 212.

For example, portions of a top surface 224 and a bottom surface 226 of the container 218 may be transparent in order for light to enter/exit the container 218. Notably, the transparent portions may be transparent to the type of emitted light. For instance, when the emitted light is UV light, the transparent portions may be transparent to UV light. Example materials of the transparent portions may include glass and/or any other material that is transparent to the emitted light.

As also shown in FIG. 2A, the optical component 204 may include mirrors 206a, 206b arranged in an interior of the container 218. The mirrors 206a, 206b may be arranged to reflect at least a portion of the emitted light that enters the optical component 204. The mirrors 206a, 206b may each reflect a portion of the emitted light at an angle toward the photo-patternable material 212 in order to expose the photo-patternable material 212 with angled exposure light. The particular angle at which the reflected light may expose the photo-patternable material 212 may depend on orientation angles $\theta_a$, $\theta_b$ at which the mirrors 206a, 206b may be arranged. As such, the mirror orientation angles $\theta_a$, $\theta_b$ may be determined based on a desired exposure angle at which to expose the photo-patternable material 212.

Within examples, the mirrors 206a, 206a may be surface mirrors, concave mirrors, convex mirrors, prisms, and/or diffractive mirrors. In some examples, the mirrors 206a, 206b may be identical mirrors. Further, the mirrors 206a, 206b may be rigidly coupled to a surface of the optical component 204, and therefore the angles $\theta_a$, $\theta_b$ may be fixed. Alternatively, the coupling components 220a, 220b may be adjustable that may be adjusted in order to adjust the mirror orientation angles $\theta_a$, $\theta_b$. Within examples, the adjustable coupling components 220a, 220b may be adjusted manually and/or may include motorized components that may be adjusted automatically.

Additionally, the container 218, or a portion thereof, may be filled with a light-coupling material 208. The light-coupling material 208 may be a solid (e.g., clear acrylic and cured silicone or epoxy), liquid, adhesive, or gel that fills at least a portion of an interior of the container 218. In an example, the light-coupling material 208 may be any material that has a refractive index sufficient to support transmission of light rays which, after refraction, have the desired angle in the photoresist. For instance, the light-coupling material 208 may be purified water (refractive index~1.33), glycol (refractive index~1.43), and glycerol (refractive index~1.47), among other examples.

In an embodiment, the fabrication system 200 may also include an aperture mask 210 that may be used to select a portion of the emitted light. In an implementation, the aperture mask 210 may be optically coupled to a surface through which emitted light enters the optical component 204. In this implementation, the aperture mask 210 may select a portion of the light entering the optical component 204. For example, as shown in FIG. 2A, the aperture mask 210 may include four openings 222a, 222b, 222c, 222d through which portions of the emitted light may enter the optical component 204.

In an embodiment, each of the openings of the aperture mask 210 may correspond to a respective desired feature for exposure in the photo-patternable material 212. The aperture mask 210 may be used to define the approximate fields of different angles of exposure light by selectively allowing light to pass through the mask's openings. Each opening may allow a respective portion of light to pass through, which may then be used (directly or indirectly) to expose a particular feature in the photo-patternable material 212.

For example, the aperture-mask 210 may include four openings, and therefore, may be used to expose four desired features in the photo-patternable material 212. In FIG. 2A, the four features may be two normally incident regions, a +45 degree angled region, and a −45 degree angled region. As explained herein, the normally incident regions may be exposed by exposure light that is normal to the photo-patternable material 212, and the angled regions may be exposed by exposure light that has a non-normal angle with respect to the photo-patternable material 212. Accordingly, the openings that correspond to the regions angled structures may be positioned such that light that passes through the openings is directed toward one or more mirrors within the container 218 in order to be reflected towards the photo-patternable material 212 at an angle.

The fabrication system 200 may also include a photomask 228. As illustrated in FIG. 2A, in an embodiment, the photomask 228 may be located near the substrate 214, perhaps placed above the photo-patternable material 212. In an embodiment, the photomask 228 may be used to define individual lightguide structures in the photo-patternable material 212. In particular, the photomask 228 may include a pattern of openings or transparencies that allow exposure light to shine through. In an embodiment, the pattern may correspond to a desired arrangement of lightguide structures on the substrate 214. That is, the photomask 228 may include openings that correspond to vertical structures and/or angled structures. When the substrate 214 is exposed with light, the light that shines through an opening that corresponds to a vertical structure creates a vertical structure in the photo-patternable material 212, and the light that shines through an opening that corresponds to an angled structure may create an angled structure in the photo-patternable material 212. As explained herein, light that is reflected from mirrors 220a, 220b may shine through the openings of the photomask 228 that correspond to the angled structures.

As also shown in FIG. 2A, a light-coupling material 230 may be placed between a bottom surface 226 of the container and the photomask 228. In an implementation, the light-coupling material 230 may be pure water that is injected on top of the substrate 214. The light-coupling material 230 may allow light that shines through the bottom surface 226 to couple to the photo-patternable material 212, as opposed to being reflected back. Within examples, the fabrication system 200 may include other light-coupling materials, perhaps between the photo-patternable material 212 and the substrate 214, and/or between the substrate 214 and the opaque material 216.

Figure 2B:
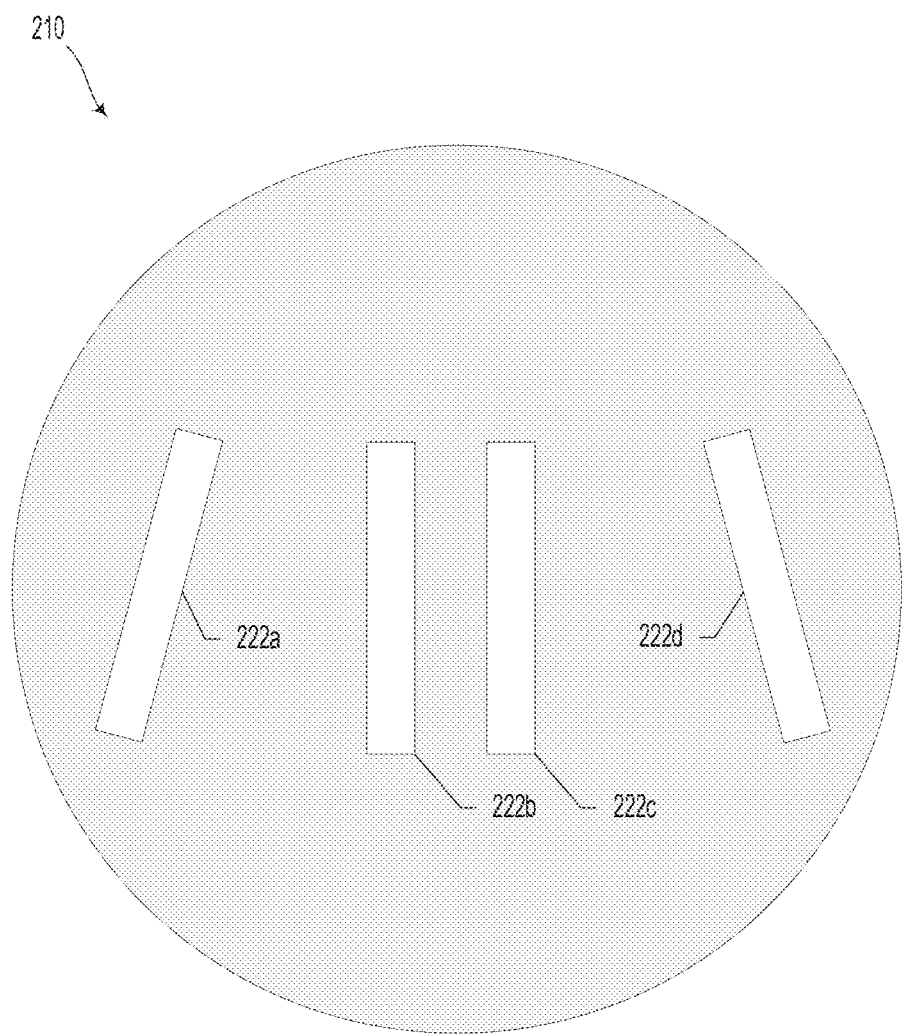
FIG. 2B illustrates a top view of an aperture mask, according to an example embodiment.

FIG. 2B illustrates a top view of an aperture mask 210, according to an example embodiment. The aperture mask 210 may include opaque features and transparent features that allow light to pass through. The combination of opaque features and transparent features may define various openings in the aperture mask 210 including the openings 222a, 222b, 222c, and 222d. In an example, the openings 222a, 222d may correspond to angled structures, and the openings 222c, 222d may correspond to vertical structures.

Figure 2C:
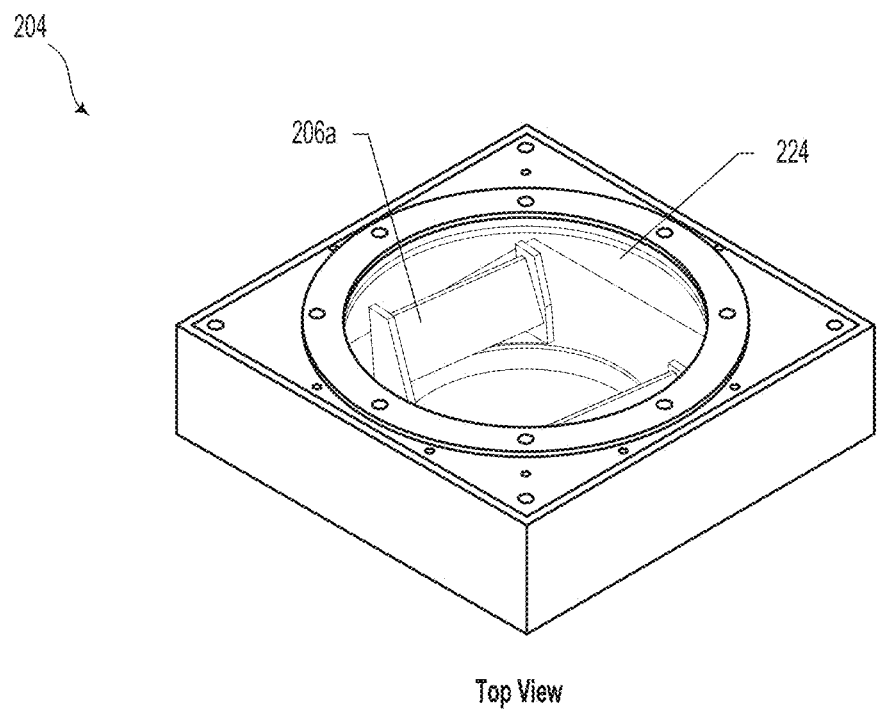
FIG. 2C illustrates a top view of the optical component of FIG. 2A, according to an example embodiment.
Figure 2D:
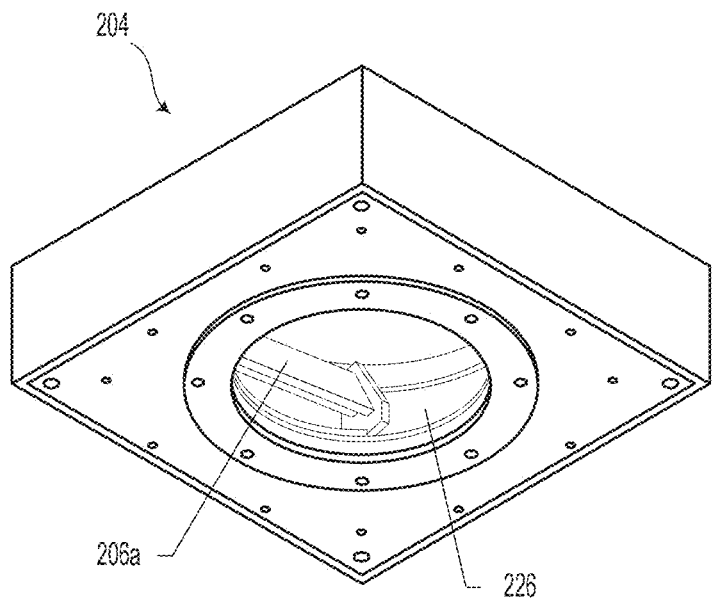
FIG. 2D illustrates a bottom view of the optical component of FIG. 2B, according to an example embodiment.

FIGS. 2C and 2D illustrate a top view and a bottom view of the optical component 204, respectively, according to example embodiments. As shown in FIG. 2B, a top surface 224 of the optical component 204 may include the transparent portion through which emitted light may enter the optical component 204. At least a portion of the light that enters the optical component 204 may be reflected off of mirror 206a toward the transparent portion of the bottom surface 226 of the optical component 204.

The example fabrication system provided in FIGS. 2A, 2C, and 2D and the accompanying description herein is for illustrative purposes only and should not be considered limiting. As an example, the optical component 204 may also include structures and/or devices for removing stray light. The structures may be dark baffles that are arranged in the optical component 204 in order to remove stray light (e.g., light reflected back into the optical component 204). As another example, an exterior of the container 218 may include plumbing fittings for filling and draining the light-coupling material 208 from the container 218. As yet another example, the exterior of the container 218 may include fittings for components to remove air bubbles. As yet another example, at least a portion of each of the mirrors 206a, 206b may be masked in order to improve directivity of the light reflected off of the mirrors 206a, 206b.

In other embodiments, the fabrication system 200 may also include mechanical and/or optical features for aligning the substrate 214 to the optical component 204 and/or the light source 202. In an example, the fabrication system 200 may include stages, fixtures, optical devices (e.g., magnifying devices), and/or image capturing devices (e.g., cameras) that may be used to align the substrate 214. In an implementation, the fabrication system 200 may include a linear stage that may be used to bring the substrate 214 in contact with an exit surface (e.g., bottom surface 226) with a light-coupling material filling a gap between the exit surface and the substrate 214. Additionally, the exit surface may include fiducials that could be used to align the substrate 214. For example, in-plane and rotation alignment may be achieved by aligning fiducials on the exit surface with features on the aperture-mask 210. In an implementation, two pairs of features may be observed simultaneously with digital cameras looking through the marks on the photomask 228 with marks on the box.

b. Example Method for Fabricating Optical Elements

Figure 3A:
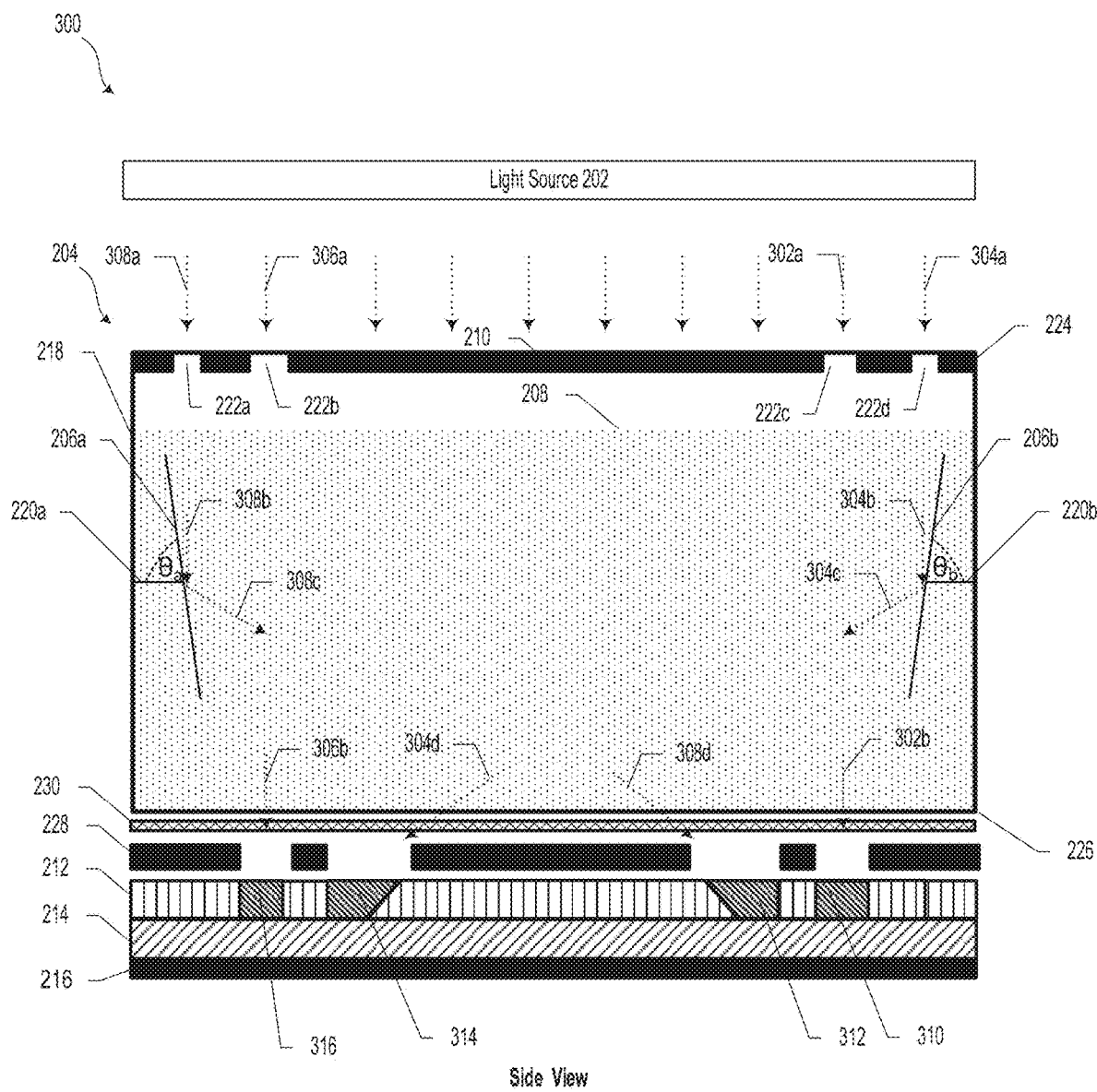
FIG. 3A illustrates a block of a method of manufacture, according to an example embodiment.

FIG. 3A illustrates a method 300 of fabricating or manufacturing an optical element, according to an example embodiment. In an embodiment, the method 300 may involve using the fabrication system 200 described in FIGS. 2A-2D so as to provide optical element 100, as illustrated and described in reference to FIG. 1A. Further, FIG. 3A may serve as an example illustration for at least some of the blocks or steps described in relation to method 400 as illustrated and described in relation to FIG. 4.

In an embodiment, the method 300 may involve determining desired structures to fabricate, such as vertical structures and/or angled structures. Additionally, the method 300 may involve determining parameters of the desired structures. For example, the method 300 may involve determining dimensions of the desired structures. Additionally, for the desired angled structures, the method 300 may involve determining a desired slope angle. For example, the desired slope angle may be ±45 degrees.

As explained above, the desired slope angle of the angle structures may determine the mirror orientation angles. Accordingly, the method 300 may also involve determining the mirror orientation angles $\theta_a$, $\theta_b$, which may be determined using Snell's law. Snell's law states that a ratio of the sines of the angles of incidence and refraction is equivalent to the reciprocal of a ratio of the indices of refraction, which is represented by the following formula:

$$\frac{\sin\theta_2}{\sin\theta_1} = \frac{n_1}{n_2} \qquad (1)$$

The desired angle of refraction in the photo-patternable material 212 ($\theta_2$), the refractive index of the light-coupling material 208 ($n_1$), and the refractive index of the photo-patternable material 212 ($n_2$) are known and may be used to calculate a desired angle of incidence. For example, the angle of incidence may be within an angle range between 15 to 45 degrees (inclusive) from normal incidence. It will be understood that other angles are possible and dynamically varying angles of incidence are possible as well.

Based on the angle of incidence, the mirror orientation angles $\theta_a$, $\theta_b$ may be calculated. In particular, the angles $\theta_a$, $\theta_b$ may be calculated such that the light reflected by the mirrors 206a, 206b may be incident on the photo-patternable material 212 with the desired angle of incidence. Once the angles $\theta_a$, $\theta_b$ are calculated, the method 300 may also involve adjusting the adjustable coupling components 220a, 220$\theta_b$ such that the mirrors 206a, 206b are positioned at the angles $\theta_a$, $\theta_b$.

The method 300 may also involve providing a wafer that includes the substrate 214 that is overlaid with the photo-patternable material 212. In such scenarios, providing the substrate 214 may involve preparing the photo-patternable material 212 by depositing a photoresist onto the substrate 214 followed by baking the photoresist. Additionally, providing the wafer may include disposing a light-coupling material 230 onto the wafer. Additionally, providing the wafer may involve aligning the wafer with the optical component 204. As explained herein, aligning the wafer may involve aligning fiducials on the exit surface 226 with features on the photomask 228.

The method 300 may also involve causing the light source 202 to emit light directed towards the optical component 204. For example, the light source 202 may emit light towards the optical component 204 by way of a substantially uniform illumination intensity across a top surface 224 of the optical component 204. In example systems where the light source 202 is not positioned above the optical component 204, the light from the light source 202 may be redirected towards the optical component 204 via one or more optical elements (e.g., mirrors, light guides, etc.).

In an implementation, the emitted light may be p-polarized highly collimated light that may illuminate the top surface with light that is normal or substantially normal to the top surface. In FIG. 3A, the emitted light is represented by light rays, such as light rays 302a, 304a, 306a, 308a. As shown in FIG. 3A, the light rays 302a, 304a, 306a, 308a may be normal or substantially normal to the top surface 224 of the optical component 204.

The emitted light may enter the optical component 204 through a transparent portion of the top surface 224. In this example, the aperture mask 210 may be coupled to the top surface 224. Accordingly, the aperture mask 210 may selectively allow a portion of the emitted light to enter the optical component 204. For instance, the aperture mask 210 may allow certain portions of the emitted light to enter through the openings 222a-222d. As shown in FIG. 3A, the light 308a may enter through the opening 222a, the light 306a may enter through the opening 222b, the light 302a may enter through the opening 222c, and the light 304a may enter through the opening 222d.

As explained above, each of the openings 222a-222d may correspond to a respective desired structure for exposure in the photo-patternable material 212. Thus, the respective light that passes through each opening may correspond to the respective desired structure that corresponds to the opening. By way of example, the openings 222b and 222c may correspond to vertical structures for fabrication in the photo-patternable material 212. Accordingly, the portions of light that pass through the openings 222b, 222c may expose vertical structures in the photo-patternable material 212.

To illustrate, consider the opening 222b. As shown in FIG. 3A, the light 306a may pass through the opening 222b to enter the optical component 204. The light 306a may pass through the light-coupling material 208 and may exit the optical component 204 through the bottom surface 226 as light 306b. The light 306b may be coupled via the light-coupling material 230 to exit the bottom or exit surface 226. The light 306b may pass normally through openings of the photomask 228. The light 306b may be normal or substantially normal to the photo-patternable material 212. Therefore, a feature 316 exposed by the light 306b is a vertical or substantially vertical area of the photo-patternable material 212.

Similarly, the light 302a may pass through the opening 222c to expose a vertical or substantially vertical area 310 of the photo-patternable material 212. The light that exposes the feature 310 is depicted in FIG. 3A as light 302b. Within examples, the dimensions of the features 310 and 316 may depend on several factors including an exposure time, a power of the lamp, and/or dimensions of the openings 222b, 222c, among other factors.

On the other hand, the openings 222a and 222d may correspond to angled structures for exposure in the photo-patternable material 212. Accordingly, the light that passes through the openings 222a, 222d may expose angled structures in the photo-patternable material 212.

To illustrate this, consider the opening 222a. The light 308a may pass through the opening 222a to enter the optical component 204. The light 308a may travel through the light-coupling material 208 to illuminate the mirror 206a as light 308b. A portion 308c of the light 308b may be reflected off of the mirror 206a. The reflected light 308c may travel through the light-coupling material 208 before exiting the optical component 204 as light 308d. In particular, the light 308d may exit the optical component 204 by coupling into the light-coupling material 230. The light 308d may then shine through the photomask 228 in order to illuminate the photo-patternable material 212.

As shown in FIG. 3A, the light 308d may illuminate a portion of the photo-patternable material 212 at an angle. As explained above, the angle of incidence may be calculated based on a desired slope angle of the desired structure. Accordingly, the light 308d may be refracted in the photo-patternable material 212 at the desired refraction angle. The refracted light in the photo-patternable material 212 may expose an angled area 312 of the photo-patternable material 212. The angle of the slope of the angled area may be the desired slope angle or substantially the desired slope angle.

Similarly, the light 304a may pass through the opening 222c to expose an angled area 314 of the photo-patternable material 212. In particular, a portion 304b of the light 304a may be incident on the mirror 206b, and a portion 304c of the light 304b may be reflected off of the mirror 206b. A portion 304d of the light 304c may shine through the photomask 228 to illuminate the photo-patternable material 212 at a calculated angle of incidence, thereby exposing the angled area 314. Within examples, the dimensions of the features 312 and 314 may depend on several factors including an exposure time, a power of the lamp, and/or dimensions of the openings 222a, 222c, among other factors.

Figure 3B:
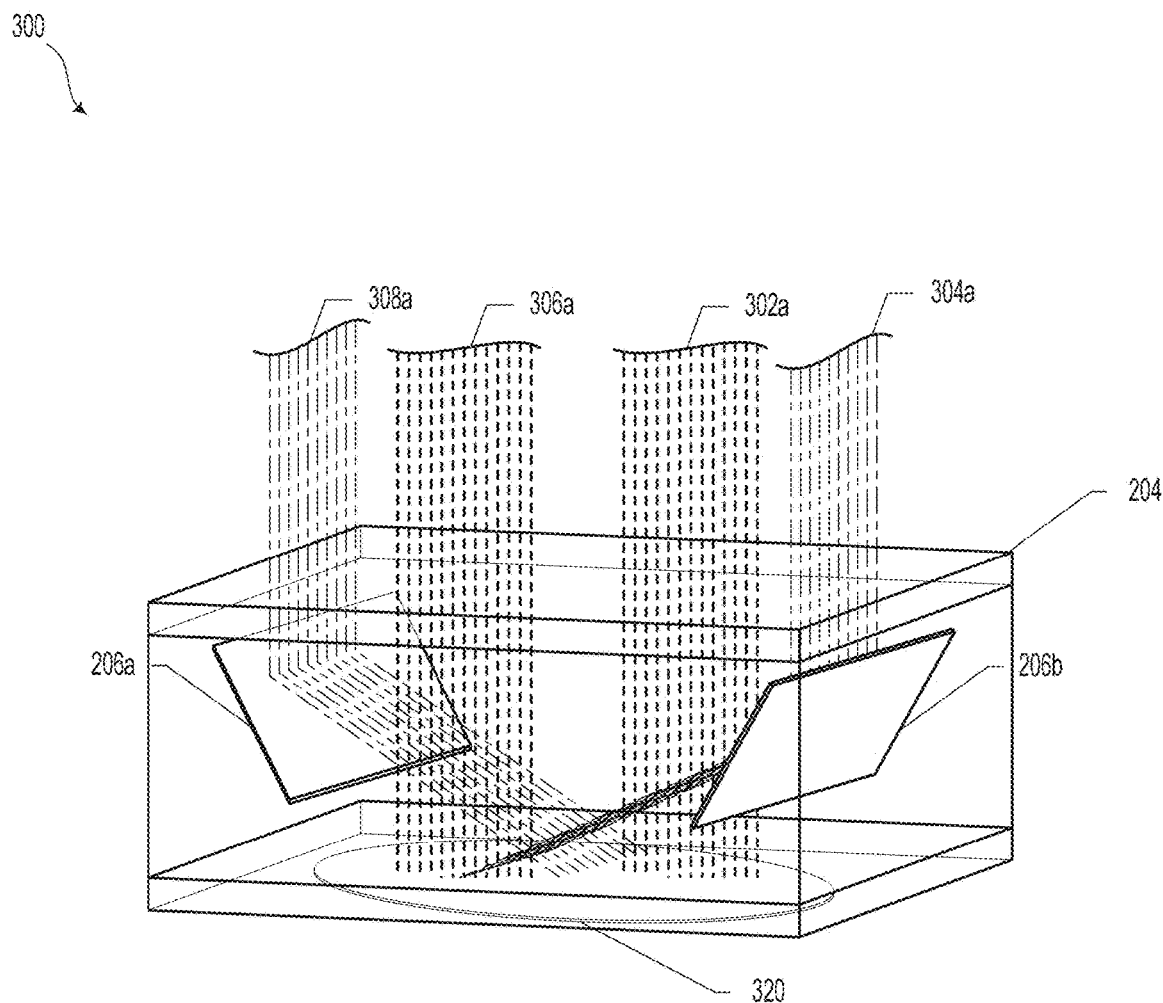
FIG. 3B illustrates a block of a method of manufacture, according to an example embodiment.

FIG. 3B illustrates an oblique view of the method 300, according to an example embodiment. In particular, the method 300 may involve exposing one or more die on a wafer 320. For instance, the method 300 may involve exposing two die on the wafer 320. In particular, vertical structures and angled structures may be exposed on each die. In an embodiment, one die may include vertical structures and angled structures of a first angle (e.g., +45 degrees), and the other die may include vertical structures and angled structures of a second angle (e.g., −45 degrees). In another embodiment, the method 300 may involve exposing a single die that has two regions of vertical structures and two regions of angled structures.

As shown in FIG. 3B, the emitted light 308a, 306a, 304a, and 302a may enter the optical component 204. As also shown in FIG. 3B, portions of the light 306a, 302a may travel normally through the optical component 204, and may expose the wafer 320 at a normal angle with respect to the wafer, thereby exposing vertical structures in both die of the wafer 320. And the light 308a, 304a may be reflected off of the mirrors 206a, 206b respectively in order to expose the wafer 320 at non-normal angles with respect to the wafer 320, thereby exposing angled structures in both die of the wafer 320. More specifically, because the light 308a and the light 304a expose the wafer 320 at angles that are offset by 90 degrees, the angles of the slopes of the respective angled structures may also be offset by 90 degrees. For example, one die may include angled structures with a slope angle of +45 degrees with respect to a surface of the wafer 320, and the other die may include angled structures with a slope angle of −45 degrees with respect to a surface of the wafer 320. Other angles are also possible.

As shown in FIG. 3B, the light reflected off of the mirrors 206a and 206b may overlap. In order to avoid the light overlapping when exposing the wafer 320, which can create jagged structures, the optical component 204 may include a bar in near positioned in a center of the optical component 204 that casts a shadow down the center of the wafer 320. Casting the shadow down the center of the wafer 320 helps avoid a region on the wafer 320 being exposed by two different non-normal angles.

Figure 3C:
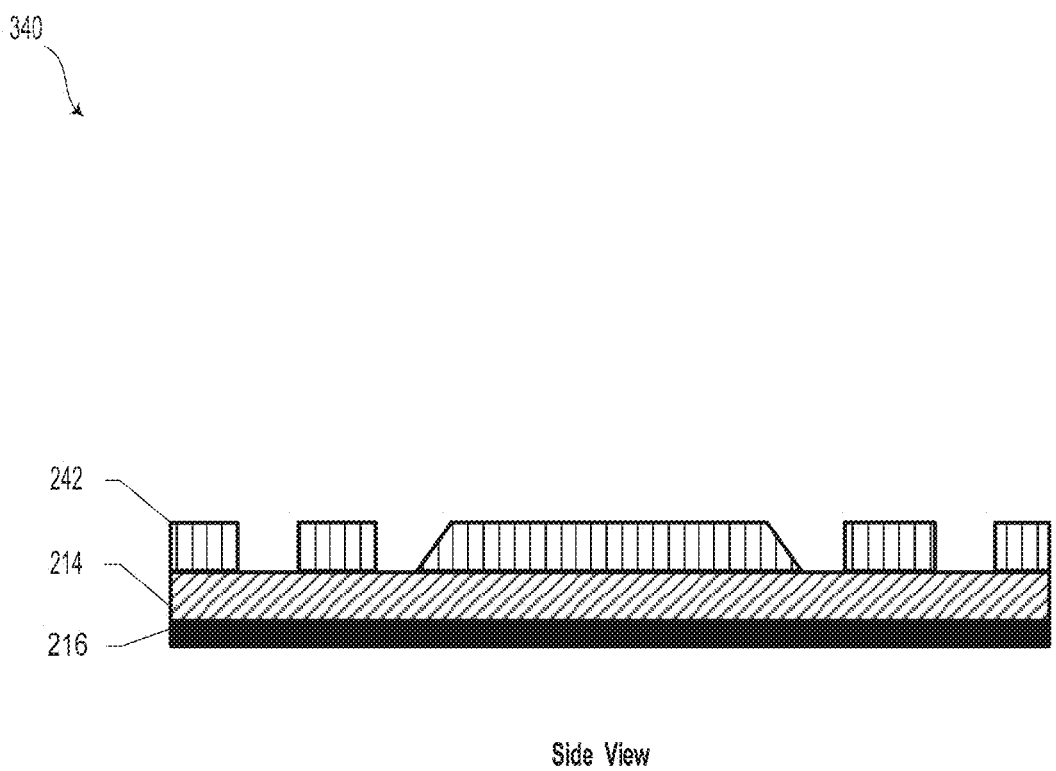
FIG. 3C illustrates a block of a method of manufacture, according to an example embodiment.

FIG. 3C illustrates block 340 that illustrates a cross-sectional profile upon development of the photo-patternable material 212. In particular, after exposure of the features 310, 312, 314, 316 and development of the photo-patternable material 212, the features 310, 312, 314, 316 may be removed to reveal surfaces of the substrate 214. Furthermore, resist features 242 may remain after resist development.

Figure 4:
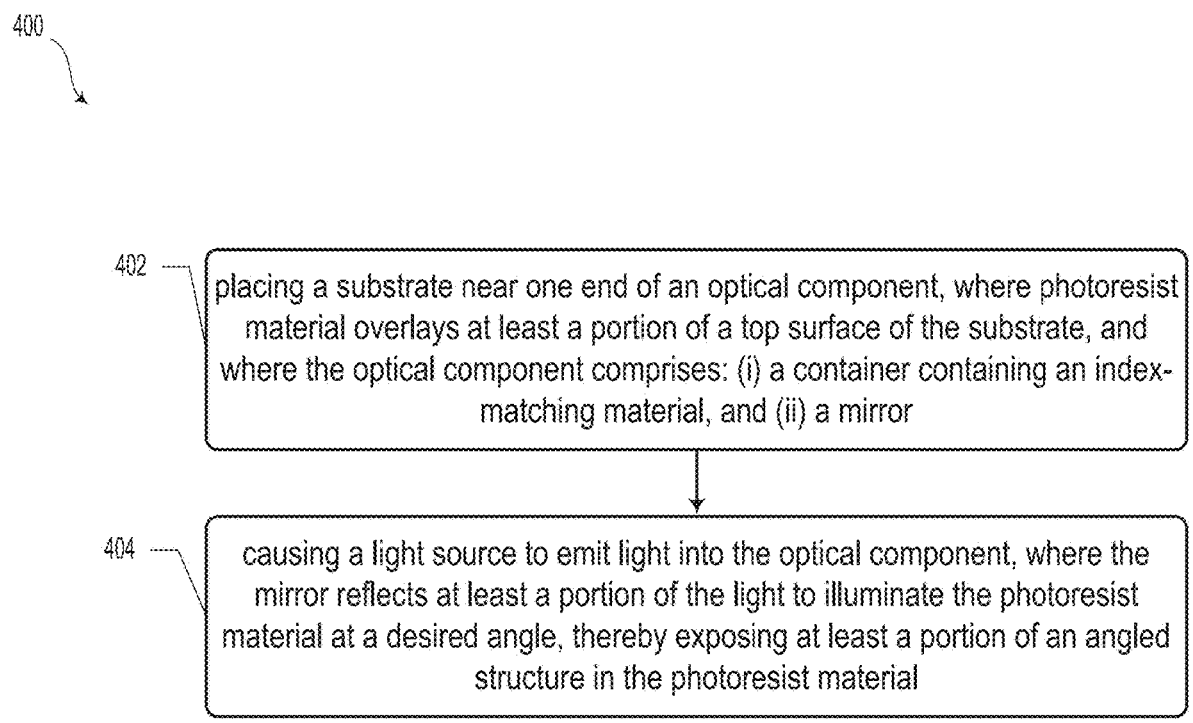
FIG. 4 illustrates a method, according to an example embodiment.

FIG. 4 illustrates a method 400, according to an example embodiment. Method 400 may be carried out, at least in part, by way of some or all of the manufacturing steps or blocks illustrated and described in reference to FIGS. 3A-3C. It will be understood that the method 400 may include fewer or more steps or blocks than those expressly disclosed herein. Furthermore, respective steps or blocks of method 400 may be performed in any order and each step or block may be performed one or more times.

Block 402 includes placing a substrate near one end of an optical component, with an optical-coupling material (e.g., a liquid or gel) placed between, where photoresist material overlays at least a portion of a top surface of the substrate, and where the optical component comprises: (i) a container containing a light-coupling material, and (ii) a mirror.

Block 404 includes causing a light source to emit light into the optical component, where the mirror reflects at least a portion of the light to illuminate the photoresist material at a desired angle, thereby exposing at least a portion of an angled structure in the photoresist material. In example embodiments, the light source may be optically coupled to a collimating lens. Further, the light source may be an ultraviolet (UV) light source. Yet further, the light source could part of a photolithography stepper or contact lithography system. Other types of photolithography systems are contemplated and possible.

Additionally, the method 400 may involve overlaying an aperture mask on a surface of the optical component, where the aperture-mask includes one or more openings, each opening corresponding to a respective desired structure in the photoresist material.

Additionally, the method 400 may involve overlaying a photomask near a surface of the substrate. In particular, the photomask may be positioned above the photoresist material covering the top surface of the substrate. In an embodiment, the photomask may be used to define the desired lightguide structures in the photoresist material.

Additionally, the method 400 may involve developing the photoresist material so as to retain an elongate portion of the photoresist material on the substrate, where a first end of the elongate portion comprises the angled structure, and where the angled structure is sloped at an angle with respect to respect to the top surface of the substrate.

Additionally, the method 400 may involve immersing the substrate in the light-coupling material with the top surface of the substrate facing a bottom surface of the container. Such a bath may include a liquid such as water or another type of fluid. In such scenarios, causing the light source to illuminate the photoresist material could include causing the light source to illuminate the photoresist material through at least a portion of the liquid. It will be understood that a variety of different immersion lithography techniques are possible within the context of the present disclosure. All other such immersion lithography techniques are contemplated herein.

Although embodiments herein are described in reference to photolithography by large area exposure, it will be understood that the definition of the optical elements, angled portions, and other structures herein may be provided using, among other techniques, direct write lithography techniques, such as laser direct writing and/or electron beam lithography. All such other techniques are possible and contemplated herein.

c. Additional Embodiments

FIGS. 5A-5E illustrate additional example embodiments of fabrication systems for fabricating optical elements, according to example embodiments. Notably, each embodiment may be configured to fabricate optical elements that include vertical and/or angled structures.

Figure 5A:
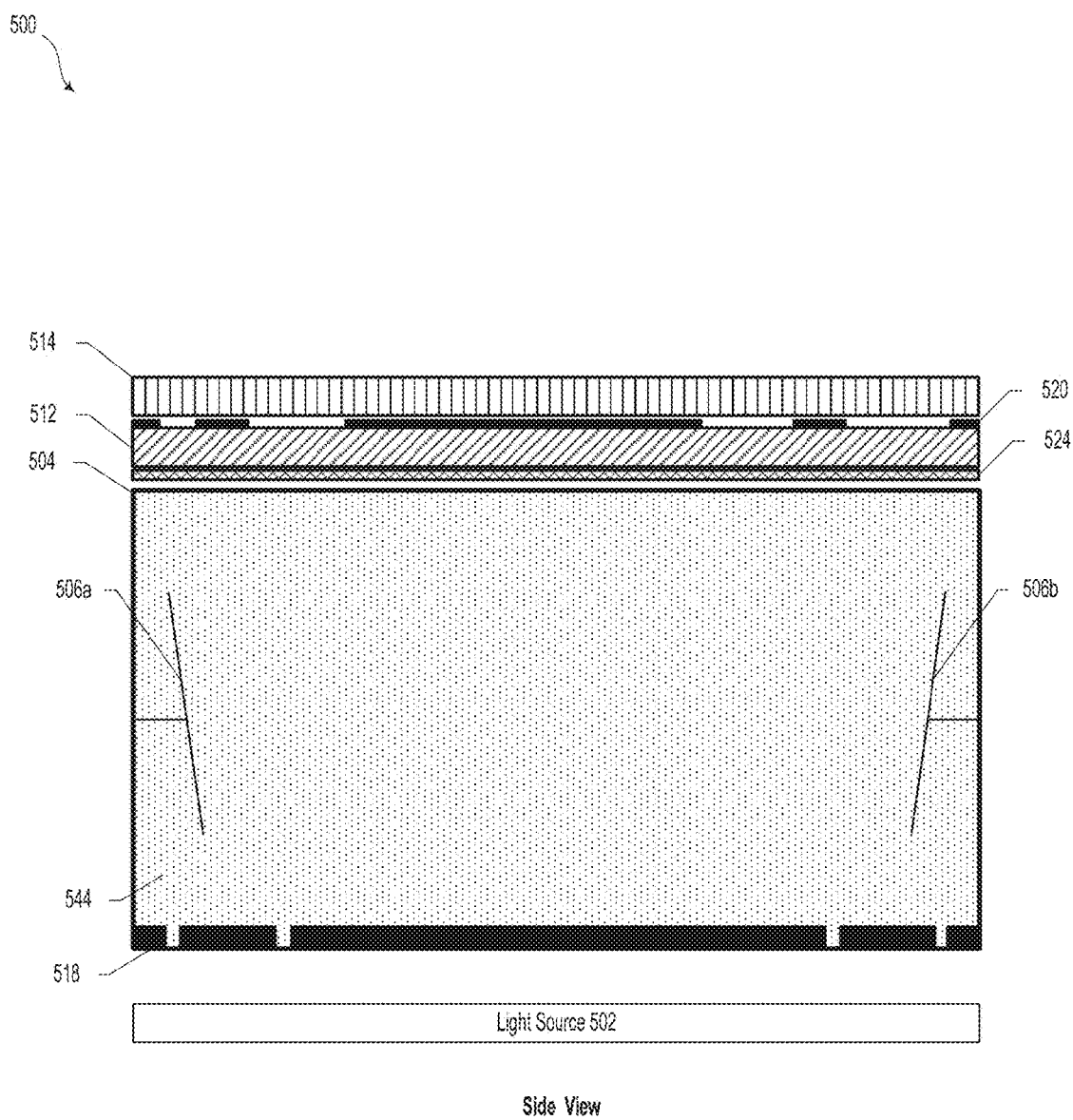
FIG. 5A illustrates a fabrication system, according to an example embodiment.

FIG. 5A illustrates a fabrication system 500, according to an example embodiment. The fabrication system 500 may include a light source 502, an optical component 504, and a substrate 512. As shown in FIG. 5A, the substrate 512 may include a photomask 520. The photomask 520 may be a photomask (e.g., chrome photomask) that is fabricated directly onto the substrate 512. A photo-patternable material 514 may be deposited onto a top surface of the substrate 512. Additionally, a light-coupling material 524 may be disposed between the substrate 512 and an exit surface of the optical component 504. The optical component 504 may include a container that contains a light-coupling material 544 and mirrors 506a, 506b. Additionally, the fabrication system 500 may include an aperture mask 518 that is placed near a surface of the optical component 504 that is proximate to the light source 502.

In this embodiment, to fabricate the desired lightguide structures, the substrate 512 may be exposed through its back surface (i.e., a surface opposite to the surface on which the photo-patternable material 514 is overlaid). In particular, the light source 502 may emit light that passes through the aperture mask 518. The aperture mask 518 may define the approximate fields of different angles of light by selectively allowing light to pass through the mask's openings. In particular, some light may be reflected off of mirrors 506a, 506b to travel through the light-coupling material 544 at an angle, while other light may travel normally through the light-coupling material 544.

The light, both angled and normal, may exit through an exit surface of the optical component 504 to enter the substrate 512 through the back surface of the substrate 512. The light may travel through the substrate 512 to exit through a top surface of the substrate 512 (i.e., the surface on which the photo-patternable material 514 is overlaid). The photomask 520 may selectively allow the light to exit the substrate 512. As explained above, openings of the photomask 520 may correspond to vertical structures or angled structures. Thus, the light that shines through the photomask 520 may expose the lightguide structures in the photo-patternable material 514.

Figure 5B:
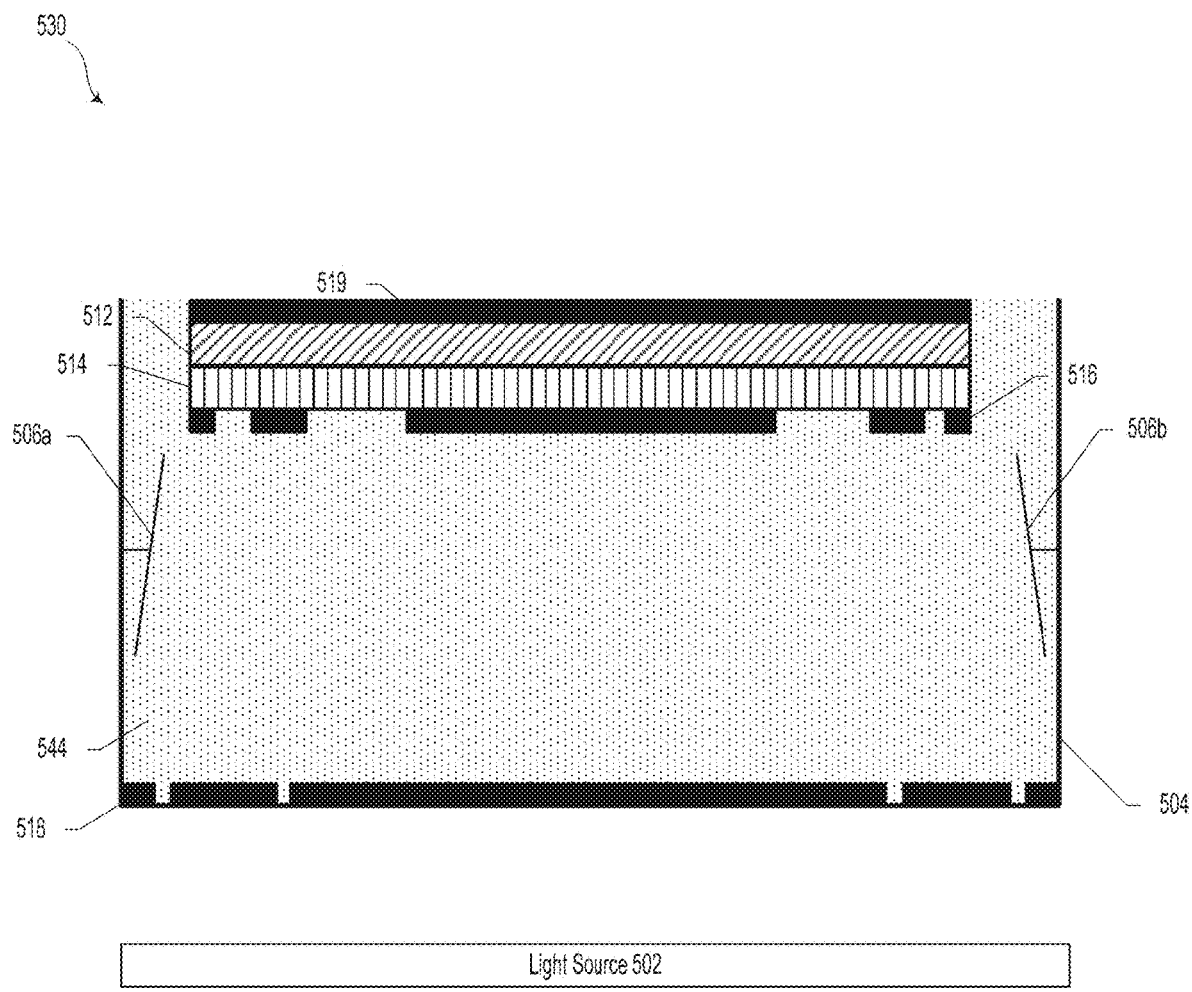
FIG. 5B illustrates another fabrication system according to an example embodiment.

FIG. 5B illustrates a fabrication system 530 for fabricating optical elements, according to an example embodiment. In this embodiment, the substrate 512 is immersed in the light-coupling material 544. Within examples, the optical component 504 may include one or more mechanical components to immerse the substrate 512. Further, the substrate is immersed such that the top surface of the substrate 512 is facing a light entry surface of the optical element (i.e., the surface near which the aperture mask 518 is disposed). As shown in FIG. 5B, a photomask 516 may be placed in proximity of the photo-patternable material 514. Additionally, an opaque material 519 may be placed at the back surface of the substrate 512.

In this embodiment, the photo-patternable material 514 may be exposed by light emitted from the light source 502. In particular, the emitted light may enter the optical component 504 by passing through the aperture mask 518, which roughly defines the angles of the exposure light by directing light some light to travel normally through the light-coupling material 544 while directing other light to travel at angle by being reflected off of the mirrors 506a, 506b. The exposure light may then expose the photo-patternable material 514 by shining through openings of the photomask 516, which defines the individual lightguide structures in the photo-patternable material 514.

Figure 5C:
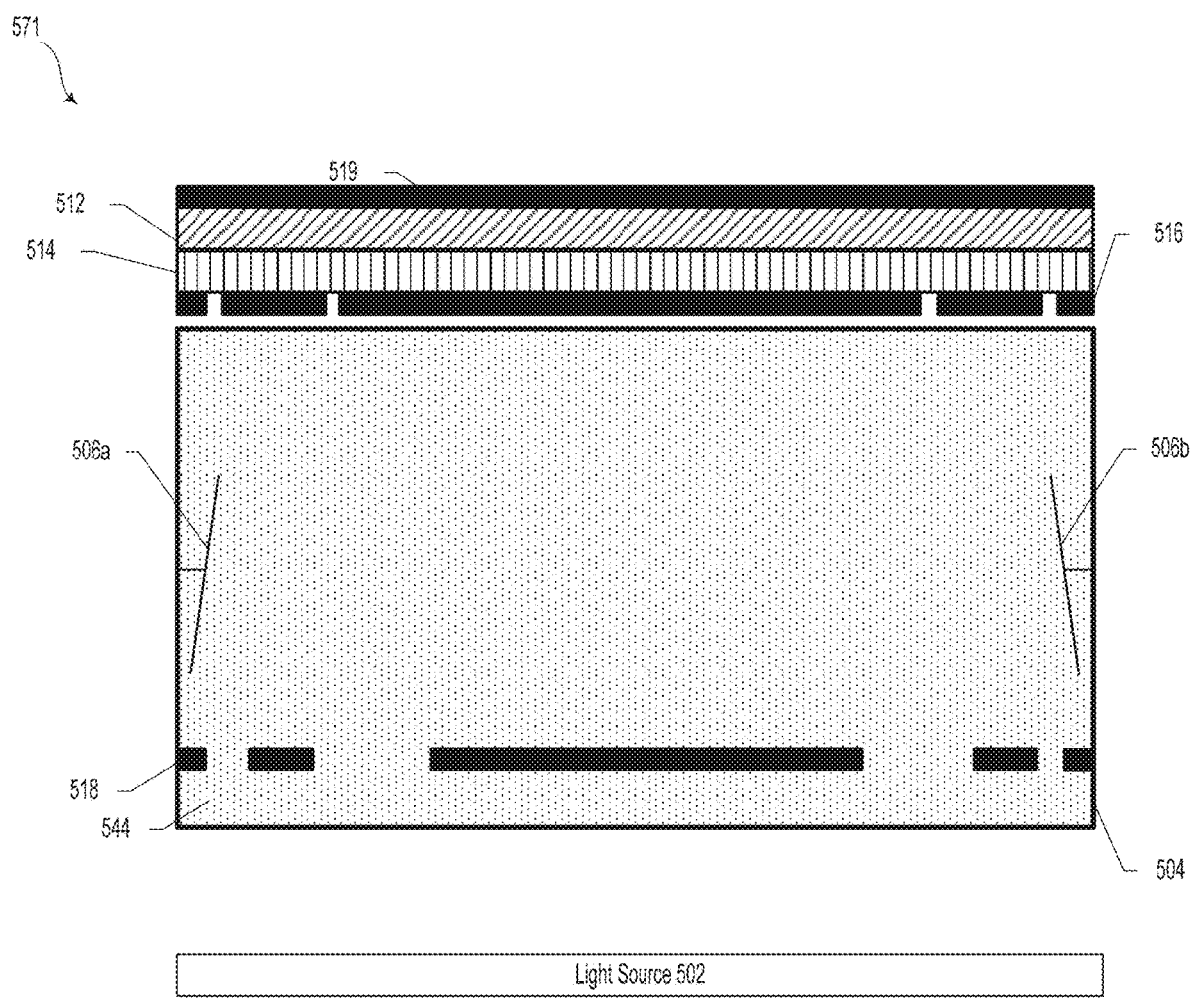
FIG. 5C illustrates another fabrication system, according to an example embodiment.

FIG. 5C illustrates a fabrication system 571 for fabricating optical elements, according to an example embodiment. Like the embodiment in FIG. 5B, the light source 502 is placed beneath the optical component 504. Here, however, the substrate 512 is placed above the optical component 504 as opposed to being immersed in the light-coupling fluid 544. In an embodiment, the substrate 512 may be placed in a second container filled with a light-coupling material (e.g., pure water). The second container may be placed above the container of the optical component 504. Furthermore, the aperture mask 518 may be placed at or near the light entry surface of the optical component 504. This embodiment may facilitate using the fabrication system without introducing any impurities to the optical component 504.

Figure 5D:
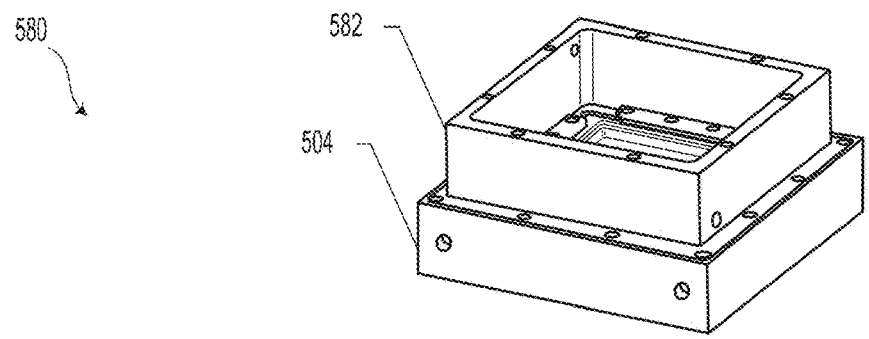
FIG. 5D illustrates another fabrication system, according to an example embodiment.
Figure 5D:
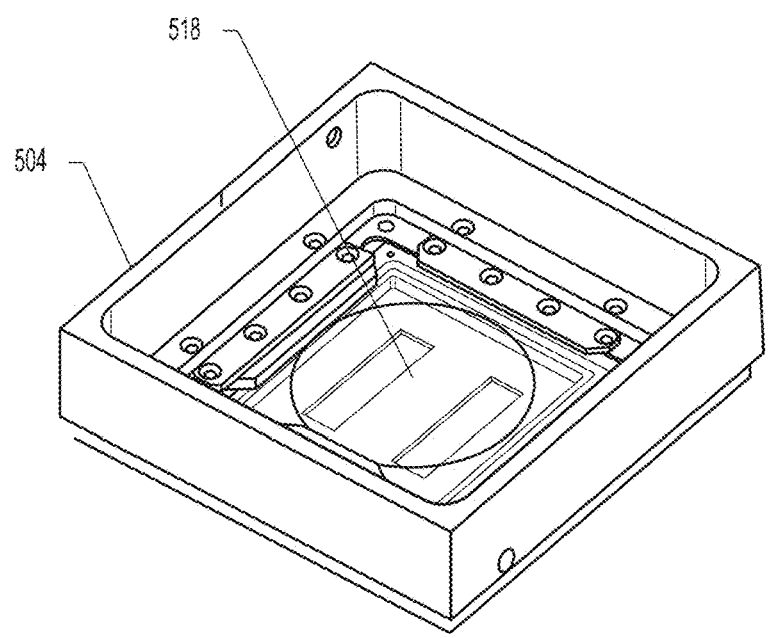
Figure 5D:
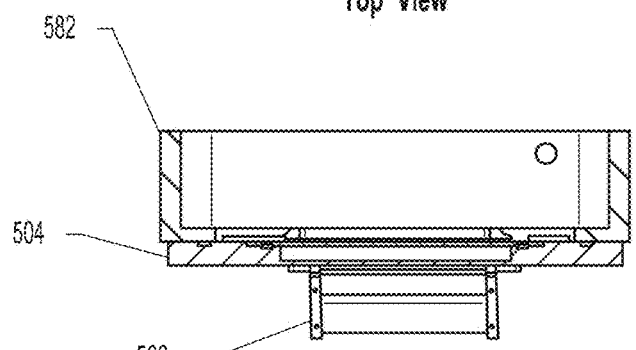

FIG. 5D illustrates different views of the fabrication system 571, according to exemplary embodiments. As shown in FIG. 5D, the fabrication system 571 may include a second container 582 arranged above the container of the optical component 504. The second container 582 may be open from a top side. The opposite side may be placed directly above the optical component 504. Furthermore, in this embodiment, the substrate 512 may be placed above a light exit surface of the optical component 504. Further, in an implementation, the aperture mask 518 may serve as the exit surface of the optical component 504.

Figure 5E:
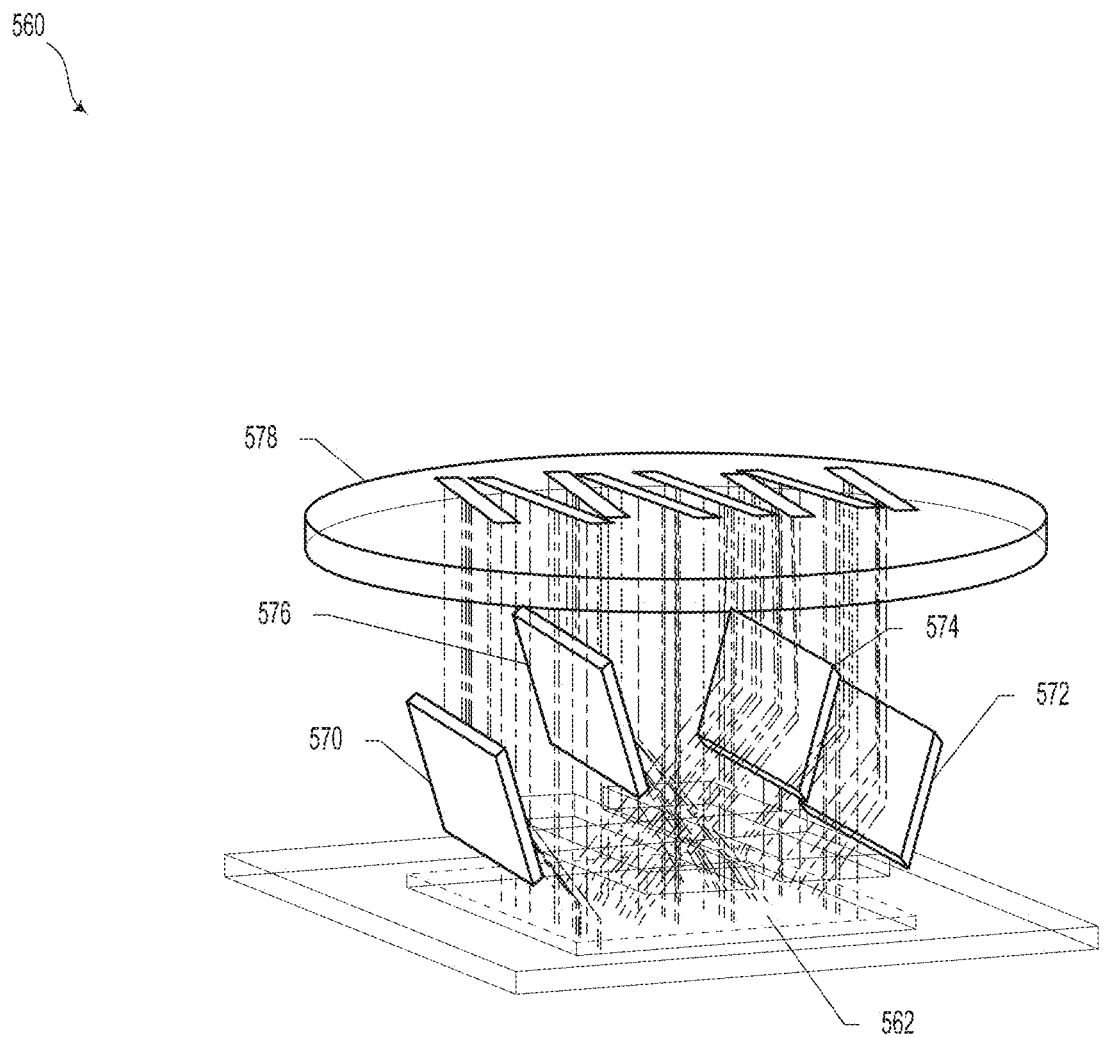
FIG. 5E illustrates another fabrication system, according to an example embodiment.

FIG. 5E illustrates a fabrication system 560, according to an example embodiment. In an embodiment, the fabrication system 560 may be configured to expose multiple die on a single wafer. In an example, the fabrication system 560 may be configured to expose two die on a 200 mm substrate simultaneously. In another example, the fabrication system 560 may be configured to expose four die on a 200 mm substrate simultaneously.

As shown in FIG. 5E, the fabrication system 560 may include an aperture mask 578 and an optical element that includes (i) an light-coupling material (not illustrated), and (ii) four mirrors 570, 572, 574, 576. In an example, the fabrication system 560 may be configured to expose vertical structures and angled structures in each of the four dies on the wafer 562. Accordingly, the aperture mask 578 may include a respective opening for the vertical structures and the angled structures on each die. That is, each die may be exposed by exposure light that is normal to the wafer 562. Additionally, each die may be exposed by light that is reflected off of a respective one of the mirrors 570, 572, 574, or 576.

IV. CONCLUSION

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information, such as a block of a method described above, may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

We claim:

1. A system comprising:
    a first mask, wherein the first mask comprises two or more openings;
    an optical assembly configured to direct light emitted by a light source into the optical assembly through the two or more openings of the first mask to illuminate a photoresist material at a desired angle of incidence and to expose an angled structure and a vertical structure in the photoresist material, wherein the photoresist material overlays at least a portion of a top surface of a substrate, and wherein the optical assembly comprises:
    a container containing a light-coupling material that is selected based in part on the desired angle of incidence; and
    a mirror arranged within the container and between the first mask and a second mask to reflect only a first portion of the emitted light to illuminate the photoresist material at the desired angle of incidence,
    wherein the second mask is arranged in proximity of the photoresist, and
    wherein the second mask is configured to define individual desired structures in the photoresist.

2. The system of claim 1, wherein each opening of the first mask corresponds to a respective desired structure in the photoresist material, wherein at least a portion of the emitted light that shines through each opening exposes the respective desired structure to which the opening corresponds.

3. The system of claim 2, wherein a first opening of the first mask that corresponds to the angled structure directs the first portion of the emitted light to the mirror.

4. The system of claim 2, wherein the optical assembly is further configured to direct the emitted light from the light source to illuminate the photoresist material at a substantially normal angle and to expose a vertical structure in the photoresist material, wherein a first opening that corresponds to the vertical structure directs a second portion of the emitted light to the photoresist material.

5. The system of claim 1, wherein at least a portion of a top surface and at least a portion of a bottom surface of the container are transparent, wherein the emitted light enters the container through the transparent portion of the top surface, and wherein the emitted light illuminates the photoresist material through the transparent portion of the bottom surface.

6. The system of claim 1, further comprising a second mask fabricated on the top surface of the substrate, wherein the photoresist overlays the second mask, and wherein the emitted light illuminates the photoresist through a bottom surface of the substrate.

7. The system of claim 1, wherein the light source comprises a polarization filter, wherein the emitted light is p-polarized light, and wherein the p-polarized light reduces light reflections from at least one of: (i) an interface between the substrate and the photoresist, and (ii) a bottom surface of the substrate.

8. The system of claim 1, wherein the optical assembly further comprises a device configured to remove stray light within the optical assembly.

9. The system of claim 1, wherein the light source is an anisotropic collimated light source.

10. The system of claim 1, wherein the optical assembly further comprises:
    a second mirror arranged to reflect at least a second portion of the light to illuminate the photoresist material at a second desired angle of incidence.

11. The system of claim 1, wherein the light-coupling material comprises at least one of: water, glycol, and glycerol.

12. The system of claim 1, wherein the substrate is immersed in the light-coupling material such that the photoresist material is facing a bottom surface of the container, wherein at least a portion of the bottom surface of the container is transparent, and wherein the emitted light from the light source enters the container through the transparent portion of the bottom surface of the container.

13. The system of claim 1, wherein the light-coupling material is a first light-coupling material, wherein the container is a first container, wherein the substrate is immersed in a second light-coupling material in a second container arranged above the first container, wherein respective portions of bottom surfaces of the first and second container are transparent, and wherein the emitted light enters the first container through the transparent portion of the bottom surface of the first container and then enters the second container through the transparent portion of the bottom surface of the second container.

14. A method comprising:
    placing a substrate near one end of an optical assembly, wherein a photoresist material overlays at least a portion of a top surface of the substrate, and wherein the optical assembly comprises: (i) a container containing an light-coupling material that is selected based in part on a desired angle of incidence, and (ii) a mirror;

overlaying a second mask in proximity of the photoresist material, wherein the second mask is configured to define individual desired structures in the photoresist material:

overlaying a first mask on or near a surface of the optical assembly, wherein the first mask comprises two or more openings; and causing a light source to emit light into the optical assembly through the two or more openings of the first mask, wherein the mirror (i), is arranged within the container and between the first mask and the second mask and (ii) reflects only a portion of the emitted light to illuminate the photoresist material at the desired angle of incidence, thereby exposing at least a portion of an angled structure and a vertical structure in the photoresist material.

15. The method of claim 14, further comprising:
based on the desired angle of incidence, determining an orientation angle for the mirror; and
causing the mirror to be oriented at the orientation angle.

16. The method of claim 14, wherein each opening of the first mask to a respective desired structure in the photoresist material, wherein at least a portion of the emitted light that shines through each opening exposes the respective desired structure to which the opening corresponds.

17. The method of claim 14, further comprising:
developing the photoresist material so as to retain an elongate portion of the photoresist material on the substrate, wherein a first end of the elongate portion comprises the angled structure, and wherein the angled structure is sloped at an angle with respect to respect to the top surface of the substrate.

* * * * *